United States Patent [19]

Thoms

[11] 4,353,948

[45] Oct. 12, 1982

[54] HOLE TECHNOLOGY

[75] Inventor: Roland Thoms, Mullheim, Fed. Rep. of Germany

[73] Assignee: Buckbee-Mears Company, St. Paul, Minn.

[21] Appl. No.: 148,683

[22] Filed: May 12, 1980

[51] Int. Cl.[3] ........................... H01L 7/50; B32B 3/10

[52] U.S. Cl. .................................... 428/131; 156/644; 156/661.1; 428/136

[58] Field of Search ....................... 428/131, 136, 134; 156/644, 661.1

[56] References Cited

U.S. PATENT DOCUMENTS

| | | | |
|---|---|---|---|
| 3,329,541 | 7/1967 | Mears | 156/644 |
| 3,574,013 | 4/1971 | Frantzen | 156/644 |
| 3,839,108 | 10/1974 | Leinkram | 156/644 |
| 3,973,965 | 8/1976 | Suzuki | 156/644 |
| 4,021,276 | 5/1977 | Cho | 156/661.1 |
| 4,303,466 | 12/1981 | Thoms | 156/661.1 |

OTHER PUBLICATIONS

"Nozzle Arrays in Mesa Structures Etched in Single Crystal Silicon", *IBM Tech. Disclosure Bulletin*, vol. 19, (No. 6), pp. 2249-2250 11/76.

*Primary Examiner*—Ellis P. Robinson
*Attorney, Agent, or Firm*—Jacobson and Johnson

[57] ABSTRACT

A method of making a line of sight opening in an article wherein the line of sight opening in the article is partially defined by material on one surface of the article and partially defined by material on the opposite surface of the article.

10 Claims, 5 Drawing Figures

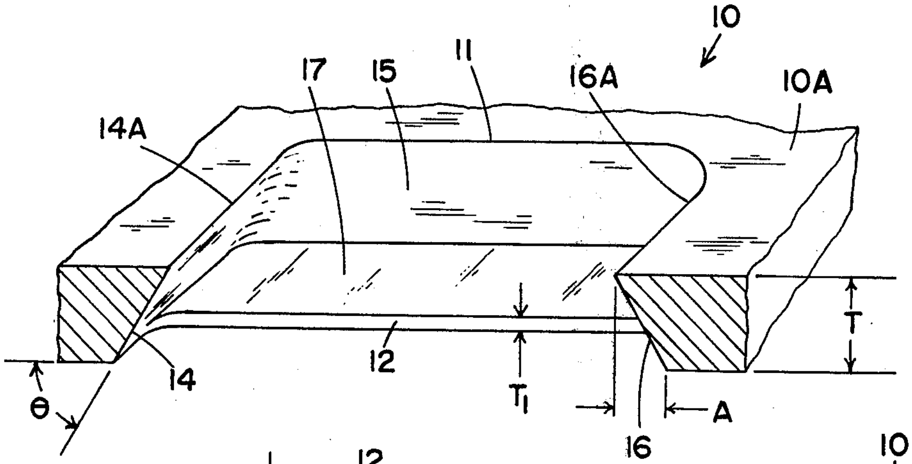
FIG. 1
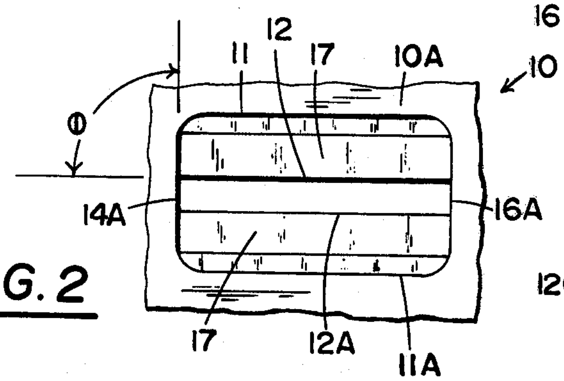
FIG. 2
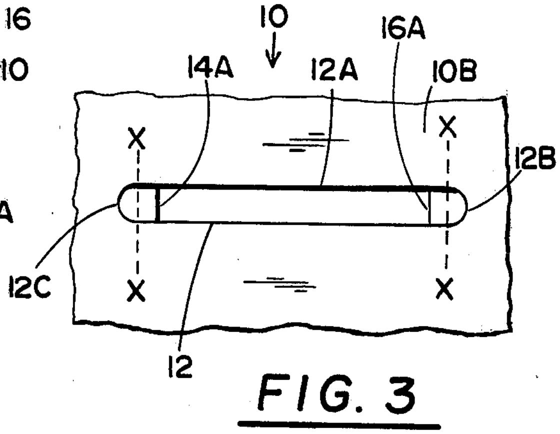
FIG. 3
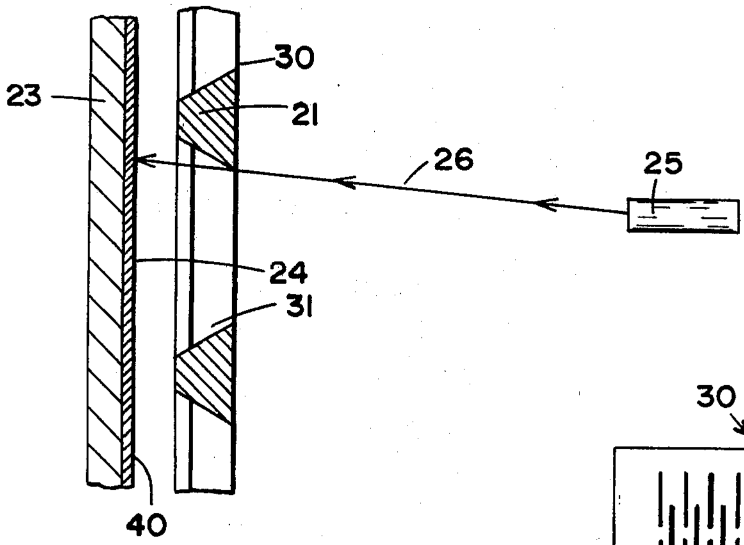
FIG. 4
FIG. 5
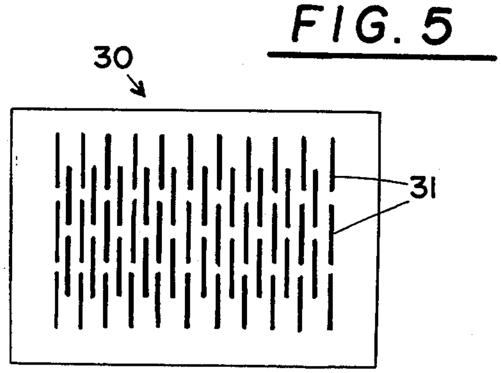

HOLE TECHNOLOGY

BACKGROUND OF THE INVENTION

1. Field of the Invention

This invention relates generally to hole technology and, more specifically, to forming line of sight openings having rectangular, square or other shapes.

2. Description of the Prior Art

The conventional concept of forming openings in material usually results in an opening having an outline with at least a portion of the boundary curved. The curvature occurs from the use of mechanical tools such as drills, milling machines or the like which use a rotary cutting action to form an opening in an article. Unless special cutting techniques are used, the opening is generally left with a radiused corner.

The characteristic of rounded corners also occurs in etching articles unless complicated compensation techniques are used to etch away any radiused corners. Even so, the results are not always satisfactory. The present invention provides a method for forming a line of sight opening with square, rectangular or other unusual shapes through the use of conventional cutting tools or etchants.

SUMMARY OF THE INVENTION

Briefly, one part of the present invention comprises a method for making a line of sight opening which may be square, rectangular or the like and the second part comprises an article having a line of sight opening which may be square, rectangular or the like. The article comprises a sheet of material having a line of sight opening wherein a portion of the edges of the line of sight opening is partially defined by surface material located on one side of the article with the remainder of the edges of the line of sight opening defined by material located on the opposite side of the article.

The process involves the selective removal of material from one surface of an article by milling or etching a recess in the article with a portion of the material removed by undercutting the surface of the article. After forming a recess, an opening is formed in the opposite side of the material by milling or etching an opening from the opposite side into the recess.

BRIEF DESCRIPTION OF THE DRAWING

FIG. 1 is a perspective view of a line of sight opening made according to the present invention;

FIG. 2 is a top view of the line of sight opening of FIG. 1;

FIG. 3 is a bottom view of the line of sight opening of FIG. 1;

FIG. 4 is a schematic illustration of an application of the invention; and

FIG. 5 is a front view of an aperture mask having a plurality of line of sight openings.

DESCRIPTION OF THE PREFERRED EMBODIMENT

Figure 6:
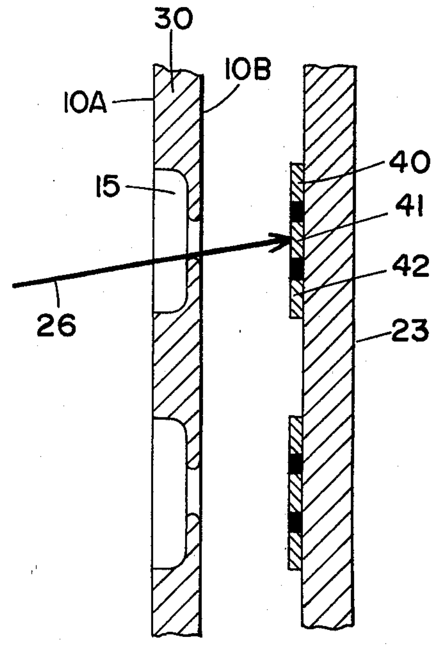

Referring to FIGS. 1, 2 and 3, reference numeral 10 generally defines a sheet of material generally having a top surface 10A and a bottom surface 10B. Top surface 10A is generally referred to as the cone side and bottom surface 10B is generally referred to as the grade side. Located in material 10 is a line of sight opening which has edges that are defined by opposite surfaces 10A and 10B of material 10. Located in top surface 10A is a recess 15 which is defined in surface 10A by a pair of side edges 11 and 11A and a pair of end edges 14A and 16A which are all located in the plane of top surface 10A of member 10. Side edges 11 and 11A connect to end edges 14A and 16A to form a closed boundary in the plane of top surface 10A. Thus, edges 11, 11A, and edges 14A and 16A define the junction of the side walls of recess 15 with the top surface 10A.

The side walls of recess 15 include an undercut surface 14 and an undercut surface 16 which respectively connect to edge 14A and edge 16A. Surfaces 14 and 16 are undercut downward and radially outward from edges 14A and 16A.

The thickness of material 10 is denoted by T with the length of undercut denoted by A. The undercut angle is denoted by $\theta$ and the thickness of the remaining material that forms the bottom of recess 15 is denoted by $T_1$ with $T_1$ being substantially less than the thickness T of article 10.

Referring to FIG. 3 (grade side), it will be noted that the bottom view shows the outline of an elongated slot in surface 10B which is defined by edge 12A, edge 12, edge 12B and edge 12C which are all located in the plane of surface 10B. Edges 12 and 12A are straight whereas edges 12B and 12C are curved. The portion of the opening to the outside of lines X—X defines the portion of the opening which contains curved edges 12B and 12C.

The line of sight opening through article 10 is formed by edges 12 and 12A which define the longitudinal opening and edges 14A and 16A which define the transverse portion of the line of sight opening. Note, in the bottom view (FIG. 3) edge 12 and edge 12A also define the longitudinal opening; and edges 14A and 16A define the transverse portion of the line of sight opening. Although the bottom view of article 10 is different from the top view of article 10, the line of sight opening through article 10 is the same for both views.

The two lines X—X, which are located on both ends of the elongated slot, denote the separation point between the curvature of edges 12B and 12C and straight sections 12A and 12B. In the embodiment shown, lines X—X are located outside of edges 14A and 16A to thereby insure the line of sight opening in article 10 is comprised of a set of straight edges with substantially square corners. The curved ends are typical of cutting operations such as machining, milling or chemical etching.

Thus, although bottom surface 10B reveals an elongated opening therein which is substantially longer than the line of sight opening through the article, the surfaces 14 and 16, which were produced by undercutting material from edges 14A and 16A, project out sufficiently far to prevent the radiused edges 12B and 12C from forming a boundary of the line of sight opening through article 10.

To understand the process of the present invention, one can form the line of sight opening in article 10 by using a cone-shaped end mill to form recess 15. Using a cone-shaped end mill one can cut a recess to depth of $T-T_1$. If the end mill is cone-shaped, the walls of recess will be undercut on all sides. Next, the article can be turned over and a conventional end mill can be used to cut the elongated opening as shown in FIG. 3. This process works well for articles of substantial thickness and size. In both cutting operations the material is only partially removed from either side of article 10, i.e., the cutting action is characterized by removing of material from opposite sides of article 10 with both cutting operation extending to a depth which is less than the thickness T of article 10.

In forming smaller openings in thinner articles, the process of etching is preferred as it permits one to etch recess 15 in material 10. Typically, the etching process is continued until it produces recess 15 with undercut surfaces 14 and 16. The size and shape of undercut surface can be controlled by the amount of etchant and time of etching and is generally within the skill of those in the art.

After forming recess 15 in one side, the elongated opening is etched from the opposite side. If desired, the elongated openings can be similarly formed during the etching of the recess by simultaneously spraying etchant on opposite surfaces 10A and 10B. After etching, the elongated slot appears with radiused corners as shown in FIG. 3. In the process of forming the line of sight opening through the article, the etching continues until the etchant penetrates through the material of thickness $T_1$. After penetration, the etchant is removed typically leaving an elongated opening such as defined by edges 12A, 12B, 12C and 12D. Lines X—X denoted the radius portion of elongated opening which results from the etching action.

An inspection of FIG. 3 shows the radius portion 12B and 12C do not project onto surfaces 15 and 16. Thus, the radiused corners 12B and 12C of article 10 do not form a part of the line of sight opening in article 10. While the article and method have been described with respect to rectangular openings, it is apparent the process can be used to make other unusual shaped line of sight openings which are difficult or impossible to make with conventional techniques.

FIGS. 4 and 5 show an application of the present invention with an aperture mask located in a color television picture tube. Reference numeral 30 identifies an aperture slot mask having a series of parallel elongated rectangular line of sight openings 31 which are spaced vertically and horizontally across mask 30. These types of masks are well known in the art and will not be described in detail herein.

FIG. 4 shows a schematic operation of a metal aperture mask 30 located in a color television tube with the cone side toward an electron gun 25 and the grade side toward the viewing side. The aperture mask acts as a shield for electrons 26 emanating from electron gun 25. Electrons pass through the line of sight opening 31 in aperture mask 30 to excite the phosphor 24 located on face plate 23. Since the electrons travel in substantially a straight path from electron gun 25, the line of sight opening 31 defines the pattern of electrons which pass through mask 30 to impinge on and excite phosphor 24. Electrons which impinge on the surface of mask 10 will be reflected rearward or away from phosphor 24. This feature is important to the television industry since the proper color brightness and sharpness of the image is a function of the accurate excitement of the phosphor regions.

The present invention thus permits one to use a substantially rectangular slot in the aperture mask as opposed to prior art masks which use elongated etched openings with radiused corners or the like. A rectangular slot has been found to permit one to have a greater open area through the masks than the conventional elongated slots used in aperture masks. The reason is because in conventional slot masks, it is necessary to use tie bars 21 for structural support of the mask. The tie bars must be spaced between ends of the elongated slots. Unfortunately, the tie bars must have a minimum dimension or mass or the entire mask will buckle when subjected to the temperature variations within the television tube.

In conventional masks the radiused corners such as shown in 12B and 12C reduce the opening area through the mask on the order of about 6% without adding any substantial strength to the mask. With the present invention, one can have substantially the same mass or mask strength with a greater open area. To utilize the line of sight openings formed by the present invention, one reverses the conventional orientation of having the cone side toward the viewing screen, instead the cone side faces electron gun 25.

To position the mask with the cone side toward the electron gun provides a mask with substantially the same mass and strength as prior art masks; however, the line of sight openings are now square rather than curved. For typical size apertures (620 micrometers by 175 micrometers) the increase in open area is on the order of about 6%. The purpose of reversing the grade and cone side is to prevent electrons from bouncing from surfaces 14 or 16 into the line of sight opening, i.e., if electrons impinge on slanted surfaces 14 and 16, the electrons would scatter through the line of sight opening. As stated, utilizing the typical dimension of an aperture mask the increased transmission is on the order of 3% to 6%. However, the increase in transmission may be larger or smaller depending on the shape and size of openings in the original masks, i.e., with larger openings in original mask the increase is smaller but with smaller openings, the increase in transmission is greater since the removal of rounded corners constitutes a greater portion of the total area.

Thus, in application of the method to an aperture mask, the tie bar dimensions remain the same; however, the line of sight openings between the tie bars are slightly greater as are the outline of the elongated opening in the aperture mask.

I claim:

1. A member having a line of sight opening therein comprising:

an article having a first surface and a second surface;

a recess located in said first surface, said recess having side walls with said side walls and said first surface coacting to define an outline of a portion of a line of sight opening in said article;

an opening in said second surface, said opening defined by edges located in said second surface, said opening extending from said second surface into said recess so that a portion of said edges of said opening in said second surface forms an outline of a portion of said line of sight opening in said article, said line of sight opening comprising an opening partially bounded by said portion of edges of said recess in said first surface and partially bounded by said edges of the opening in said second surface.

2. The invention of claim 1 wherein a portion of said side walls of said recess are undercut.

3. The invention of claim 1 wherein said article comprises a shadow mask having a plurality of openings therein.

4. The invention of claim 1 wherein said article include tie bars on the ends of said line of sight openings.

5. The invention of claim 4 wherein said line of sight openings have a rectangular shape.

6. The method of making line of sight openings in an article having two surfaces comprising the steps of:

forming a recess with side walls and a bottom in a first surface of an article with at least a portion of the side walls of the recess diverging away from said recess to provide an overhanging edge; and forming an opening into the bottom of said recess from the opposite surface of said article.

7. The method of claim 6 wherein the forming of said opening includes cutting material from the bottom of said recess.

8. The method of claim 7 wherein the forming of said recess includes etching material from said article to form a recess.

9. The method of claim 8 including the step of undercutting said side walls in said recess.

10. The method of claim 9 including the step of forming an opening in the bottom of said recess including etching an opening having end sections until the end sections of the openings extend beyond the top edge of the recess formed in said first surface.

* * * * *